United States Patent [19]

Chadwick

[11] Patent Number: 4,475,139

[45] Date of Patent: Oct. 2, 1984

[54] THYRISTOR-SWITCHED CAPACITOR APPARATUS

[75] Inventor: Philip Chadwick, Peterborough, Canada

[73] Assignee: Canadian General Electric Company Limited, Toronto, Canada

[21] Appl. No.: 336,101

[22] Filed: Dec. 30, 1981

[30] Foreign Application Priority Data

May 29, 1981 [CA] Canada .................. 378626

[51] Int. Cl.³ .................. H02H 3/20; H02H 7/10
[52] U.S. Cl. .................. 361/91; 361/56; 361/100; 361/111; 363/54; 363/68
[58] Field of Search ............ 361/100, 56, 91, 111, 361/128; 363/50, 54, 57, 68, 51, 129; 323/223, 233, 237, 292; 307/252 R, 318, 252 K, 252 Q, 252 T

[56] References Cited

U.S. PATENT DOCUMENTS

| 3,806,765 | 4/1974 | Matsuoka et al. | 361/128 |
| 3,943,427 | 3/1976 | Tolstov et al. | 361/56 |
| 4,217,618 | 8/1980 | Kellenbenz et al. | 361/56 |
| 4,282,568 | 8/1981 | Kobayashi et al. | 307/252 Q X |
| 4,371,909 | 2/1983 | Kano | 361/91 |

FOREIGN PATENT DOCUMENTS

| 959120 | 12/1974 | Canada | 323/8 |
| 1069583 | 1/1980 | Canada | 323/20 |
| 1076647 | 4/1980 | Canada | 323/21 |
| 2910788 | 12/1979 | Fed. Rep. of Germany | 361/91 |

Primary Examiner—Patrick R. Salce
Attorney, Agent, or Firm—William Freedman; John P. McMahon

[57] ABSTRACT

A protective circuit for a plurality of series connected thyristors where each thyristor has in parallel with it a resistance, capacitance type snubber circuit and a metal oxide varistor. The arrangement of the series connected thyristors, snubber circuits and their metal oxide varistors has in parallel with it a main metal oxide varistor. The main varistor is responsive to external transient surges so as to conduct large currents. The outer varistors are selected to have values so as to conduct a much smaller or minimal current relative to the current conducted by the main varistor. In a preferred arrangement, a tuning inductor is in series with the thyristors, snubber circuits and parallel arranged varistors. Also, the main varistor is arranged in parallel with the series connection of thyristor, snubber, varistor combination and inductor, and in series with a bank of capacitors.

4 Claims, 2 Drawing Figures

THYRISTOR-SWITCHED CAPACITOR APPARATUS

BACKGROUND OF THE INVENTION

This invention relates to a protective circuit for series connected semiconductor devices.

This invention is for an improvement on the general circuit arrangements shown in Canadian Pat. No. 959,120-Harnden, Jr., issued Dec. 10, 1974 to General Electric Company. In that patent there is described a circuit with two semiconductor devices, such as thyristors, connected in series across a voltage source, and a metal oxide varistor connected in parallel with each of the semiconductor devices. The metal oxide varistors have a nonlinear resistance characteristic that is pronounced. The varistors have a high resistance at voltages below a predetermined value and a relatively low resistance to high current conduction occurring at voltages above the predetermined value. It thereby protects the semiconductor devices against transient high voltage peaks.

It has been found that the above arrangement may not provide adequate protection under all circumstances. For example, a large external transient may require a varistor size that is quite large to provide protection. It may require one or two columns of varistors which cannot be designed to be easily integrated with the thyristor switch due to the physical size. Therefore a compromise may be necessary having in mind the likelihood of a sufficiently large external transient occurring and the size and space limitations.

There is another situation where the prior art protection could be inadequate depending on the design. If we consider a thyristor switch in parallel with a varistor in a circuit across a power source, there will normally be inductance in the circuit external to the parallel thyristor switch and varistor. If an external transient surge causes a transient current of say 1000 amperes to flow through the varistor, a voltage will be developed across the varistor and this will be directly across the thyristor switch. This voltage might be perhaps as high as 100 KV (kilo-volts). Now if the thyristor switch should be gated on at this time, perhaps by a misfire or incorrect operation or for any reason, the thyristor may be damaged. The instantaneous voltage across the low thyristor impedance would cause excessive current and excessive rate of change of current.

It is therefore an object of the present invention to provide improved protection for a circuit having series connected thyristors.

It is another object of the invention, to provide improved protection for series connected thyristors in a power system with a metal oxide varistor connected in parallel with each thyristor, by providing a metal oxide varistor connected in parallel with all the series connected varistors.

These and other objects of the present invention will become apparent to those skilled in the art upon consideration of the following description of the invention.

SUMMARY OF THE INVENTION

In accordance with one preferred embodiment of the present invention there is provided a protective arrangement for series connected semiconductor devices, comprising a snubber circuit in parallel with each semiconductor device, a metal oxide varistor connected in parallel with all the series connected semiconductor devices to provide protection against external transients, said metal oxide varistors connected in parallel with each semiconductor device being selected to absorb minimum energy when said another metal oxide varistor is carrying a large current due to an external transient.

In accordance with an alternate embodiment of the present invention there is provided a protective arrangement for series connected semiconductor devices, comprising a snubber circuit in parallel with each said semiconductor device, a metal oxide varistor connected in parallel with each semiconductor device, each said varistor device having a first predetermined conductive voltage rating, an inductance in series with said semiconductor devices, and a metal oxide varistor connected in parallel with said series connected semiconductor devices and said inductor and having a second conductive voltage rating slightly less than the sum of the first predetermined conductive voltage ratings.

The features of the invention believed to be novel are set forth with particularity in the appended claims. The invention, itself, however, both as to its organization and operation, together with further objects and advantages thereof, may best be understood by reference to the following description taken in conjunction with the accompanying drawings.

DETAILED DESCRIPTION OF PREFERRED EMBODIMENT

Figure 1:
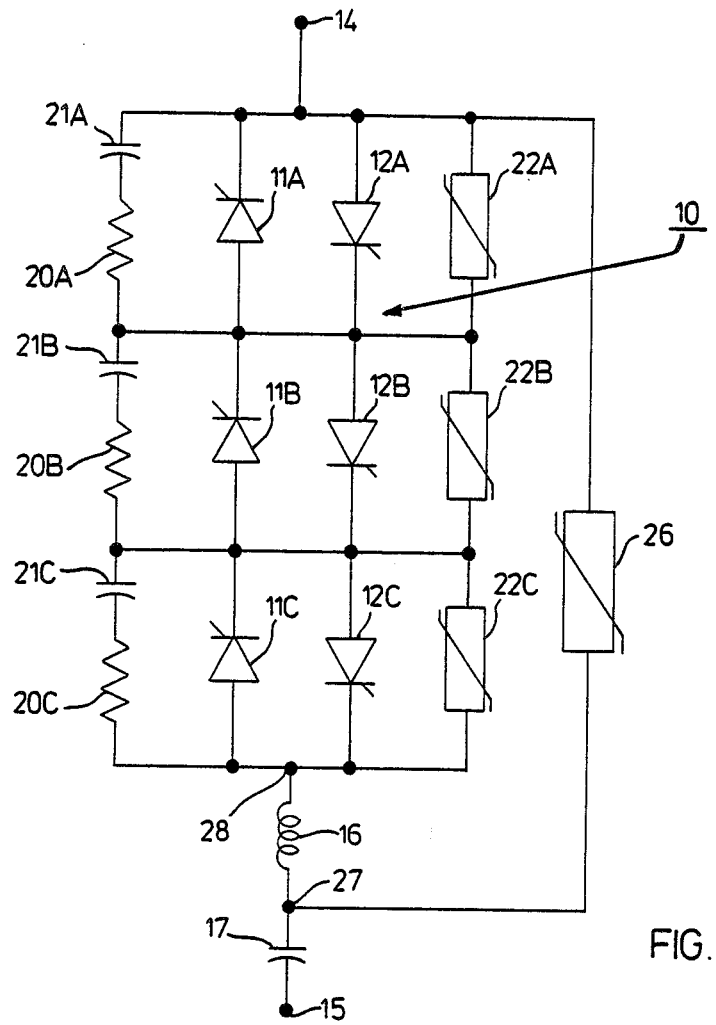
FIG. 1 is a simplified circuit diagram of a circuit according to the invention, suitable for use in a static VAR compensator circuit.

Referring to FIG. 1, there is shown a circuit, in simplified form, suitable for use in one phase of a power system for providing compensation for reactive current. Static compensators of this type are well known in the art. For example, Canadian Pat. No. 1,069,583-Kelley, Jr., issued Jan. 8, 1980 to General Electric Company, and Canadian Pat. No. 1,076,647-Frank, issued Apr. 29, 1980 to ASEA AKTIEBOLAG, show compensators of this general type. In FIG. 1 there is a bi-directional thyristor switch 10 having thyristors or silicon controlled rectifiers (SCRs) 11A, 11B and 11C connected for conduction in one direction and thyristors or SCRs 12A, 12B and 12C connected for conduction in the opposite direction. The number of SCRs connected in series for each direction is determined by circuit design considerations involving the protection level of the varistors to be subsequently discussed and the voltage of the phase, which is the voltage between terminals 14 and 15. While only three SCRs are shown in series, there could be four, five or six depending on these design considerations. It will also be apparent that each of the SCRs 11, 12 which are shown singly, could in fact be a plurality connected in parallel where current handling capacity requires it.

In series with the bi-directional switch 10 is a "tuning" inductor 16 for tuning a capacitor bank 17 to avoid resonances with the AC system and to provide harmonic filtering. The inductor 16 also limits rate of change of current in the thyristors from the external power circuit. The inductor 16 has a relatively small reactance as compared to the reactance of capacitor bank 17. The capacitor bank 17, also in series with switch 10 and inductor 16, is shown only as a single capacitor 17, but it will be understood that it represents a bank of series/parallel connected capacitors sufficient to withstand the phase voltage and provide the desired capacitance.

The present invention may be used in circuits for power systems other than static compensators, however, the invention is particularly suitable for use in static compensators and is being described for such a use.

In parallel with each pair of SCRs 11A/12A, 11B/12B, 11C/12C, is a snubber circuit comprising a series connected resistor 20 and a capacitor 21. Thus, in parallel with SCR 11A and 12A is a series connected resistor 20A and capacitor 21A, and so on. Snubber circuits are known and are connected across semiconductor devices for reducing or "snubbing" the rate of change of a sharply rising voltage transient across the semiconductor. In addition it tends to equalize the voltages across the respective series connected SCRs.

Also connected in parallel with each SCR pair is a metal oxide varistor 22, such as, for example, a zinc oxide varistor. Thus, in parallel with SCR 11A and 12A is a metal oxide varistor 22A, and so on as shown. The metal oxide varistors 22 not only may provide some minor additional snubbing action, but because of their highly non-linear voltage characteristic they provide a clipping action which clips spikes of excessive voltage.

In summary, the snubber circuits and the varistors 22 not only protect the respective SCR against the results of a rapid voltage increase across the SCR and against premature conduction, but also reduce improper operation that might be caused by voltage spikes. However, the size and therefore the rating of the varistors 22 (which can be readily integrated with the thyristor switch) is limited. It is possible that a large current transient would be too great for the varistors 22 to handle.

Figure 2:
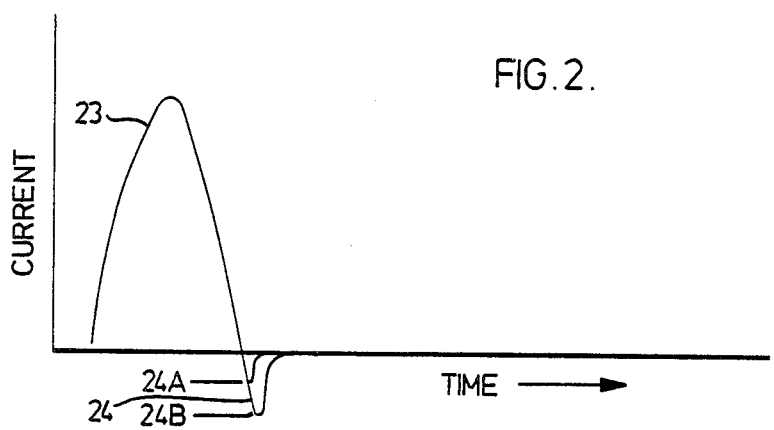
FIG. 2 is a graph of surge current plotted against time, useful in describing the invention.

Referring to FIG. 2, there is shown a current transient curve 23 which momentarily might reach several thousand amperes. For currents which have a high di/dt, as the current approaches zero, a large reverse recovery current is normally experienced as indicated by the curve portion 24. This reverse recovery current might, for example, exceed 1000 amperes. There are several paths that might conduct this current in FIG. 1. One path is through the snubber resistors 20 and capacitors 21. Another path is through SCRs 11A, B and C. Another is through SCRs 12A, B and C. Yet another is through the varistors 22A, B and C. Assume the direction is such that this reverse current is flowing largely through the low resistance path provided by SCRs 11A, B and C. The resistance of the path through the snubbers is comparatively high, perhaps, for example, of the order of 10 ohms per section. The voltage drop across the SCRs 11A, B, and C is relatively small or minimal and the metal oxide varistors 22 are not yet conducting.

It has been found to be difficult to get SCRs or any semiconductive devices with identical characteristics. In practice, the characteristics may differ. The SCRs 11A, B and C may consequently recover at current levels of, for example, between 400 amperes and 800 amperes indicated on FIG. 2 as 24A and 24B respectively. Suppose, for example, that one of the SCRs, say SCR 11B, recovers at 800 amperes with the other two still conducting. Suppose also, for the moment, that varistor 22B is not present, then the voltage across SCR 11B will increase to develop an initial voltage across it which might, for example, approach 800 amperes × 10 ohms = 8000 volts (the resistance of resistor 20B might be between 10 and 100 ohms), conceivably high enough to damage SCR 11B. The inclusion of varistor 22B will, however, limit the voltage to the protective level of the varistor. Normally the protective level of the varistor is coordinated with the voltage withstand capability of the thyristor.

As is shown in FIG. 1, a larger metal oxide varistor 26 is connected to include the metal oxide varistors 22. The varistor 26 is selected according to the phase voltage. In a normal design procedure, the varistor 26 would be selected first, then the SCRs and then varistors 22. In any case, regardless of the order of selection in design, the varistors 22 are selected to absorb minimum energy when varistor 26 is carrying a large current due to external transients. In other words, an external transient which causes a large current to flow in varistor 26 will cause only a small current in varistors 22. Varistor 26 thus provides the main protection against external surges.

It is preferred to connect the varistor 26 so that it includes the series connection of varistors 22 and the tuning inductor 16. In other words, if the junction of the tuning inductance 16 and capacitor bank 17 is designated as 27, and the junction between varistor 22C, SCR 12C, SCR 11C, resistor 20C and inductance 16 is designated as 28, then it is preferred to connect varistor 26 between terminal 14 and junction 27 as shown rather than between terminal 14 and junction 28. The varistor 26, which may be quite large physically, may be connected between terminal 14 and junction 28, and may be located away from the thyristor switch if desired. Thus it will provide the primary protection against external transients, and will confine external surges to the external loop which it forms. It can be quite large and provide a large energy handling capability. However, this is not the preferred connection for the reasons given hereinafter.

Considering a circuit with varistor 26 connected between terminal 14 and junction 28, and assuming there is an external transient causing a large current through varistor 26, there will be a large voltage across terminal 14 and junction 28. This may cause a smaller flow through the varistors 22A, B and C, but the current will be smaller because they are selected to conduct a lesser current for the three in series, for the same voltage across them. Now, if there should be a simultaneous misfire of thyristor SCR 12A, B and C, the rapid transfer of current from varistor 26 to these thyristors 12A, B and C might damage them. By connecting the varistor 26 between terminal 14 and junction 27, as shown, the tuning inductor 16 is included in the series circuit with thyristors 12A, B and C. The inductance tends to resist the transfer of current under the particular situation outlined above and thus provides additional protection.

It is believed that the arrangement and operation will now be clearly understood.

What I claim is:

1. A protection arrangement for a plurality of series connected semiconductor devices, comprising:
   a plurality of snubber circuits respectively connected in parallel with said semiconductor devices,
   a plurality of first metal oxide varistors respectively connected in parallel with said semiconductor devices, and a second metal oxide varistor connected in parallel with all the series connected semiconductor devices to provide protection against external transients, said first metal oxide varistors having a first voltage rating at which there is a marked change in conduction and said second metal oxide varistor has a second voltage rating at which there is a marked change in conduction, the sum of the first voltage ratings of said first varistors being greater than said second voltage rating.

2. A protective arrangement as defined in claim 1 and further comprising:
   an inductance in series with said semiconductor devices, and in which:
   said second metal oxide varistor is connected in parallel with said series connected semiconductor devices and said inductance.

3. A protective arrangement according to claim 1 or 2 wherein each snubber circuit is a series connected resistor and capacitor.

4. A protective circuit arrangement for series connected thyristors in a static compensator, said thyristors being connected in oppositely poled pairs and said pairs being series connected to provide a plurality of series connected thyristors poled for conduction in each direction, a tuning inductor connected in series with said pairs and a capacitor bank, comprising,
   a snubber circuit connected in parallel with each of said pairs,
   first metal oxide varistors, one of said first varistors being connected in parallel with each of said pairs to clip transient voltage spikes, and
   a second metal oxide varistor connected in parallel with the series connection of said pairs and said inductor for carrying large currents due to external transients to protect said thyristors, said first metal oxide varistors having a first voltage rating at which there is a marked change in conduction and said second metal oxide varistor having a second voltage rating at which there is a marked change in conduction, the sum of the first voltage ratings of said first varistors being greater than said second voltage rating.

* * * * *